US005847914A

United States Patent [19]

Johansen et al.

[11] Patent Number: 5,847,914

[45] Date of Patent: Dec. 8, 1998

[54] ELECTROSTATIC DISCHARGE PROTECTION DEVICE

[75] Inventors: Arnold W. Johansen, Marlboro; David V. Cronin, Peabody, both of Mass.

[73] Assignee: Polaroid Corporation, Cambridge, Mass.

[21] Appl. No.: 577,919

[22] Filed: Dec. 21, 1995

[51] Int. Cl.[6] .............. H01L 23/00

[52] U.S. Cl. .............. 361/111; 361/56; 361/118; 361/220

[58] Field of Search .............. 361/56, 111, 118, 361/127, 91, 115

[56] References Cited

U.S. PATENT DOCUMENTS

| | | | |
|---|---|---|---|
| 234,917 | 11/1880 | Cronin | 439/188 |
| 278,024 | 4/1883 | Cronin | 361/212 |
| 278,063 | 12/1883 | Cronin | 439/507 |
| 361,426 | 12/1887 | Cronin | 361/111 |
| 3,467,940 | 9/1969 | Wallo | 339/14 |
| 3,653,498 | 4/1992 | Kisor | 206/46 H |
| 3,774,075 | 11/1973 | Medesha | 317/2 R |
| 4,019,094 | 4/1977 | Dinger et al. | 361/220 |
| 4,617,605 | 10/1986 | Obrecht et al. | 361/220 |
| 4,971,568 | 11/1990 | Cronin | 439/188 |
| 5,108,299 | 4/1992 | Cronin | 439/188 |
| 5,163,850 | 11/1992 | Cronin | 439/507 |
| 5,164,880 | 11/1992 | Cronin | 361/220 |
| 5,259,777 | 11/1993 | Schuder et al. | 439/188 |
| 5,289,336 | 2/1994 | Gagliano | 361/220 |
| 5,583,733 | 12/1996 | Cronin | 361/111 |

FOREIGN PATENT DOCUMENTS

| | | | |
|---|---|---|---|
| 2348630 | 3/1975 | Germany | H01L 23/60 |
| 0071031 | 9/1983 | Germany | H01L 23/48 |
| 59-13353 | 1/1984 | Japan | H01L 23/48 |
| 61-148852 | 11/1986 | Japan | H01L 23/60 |
| 62-276855 | 1/1987 | Japan | H01L 23/60 |

OTHER PUBLICATIONS

Middlebrook, Carlton G., "Electrical Shorting Cap," *Navy Technical Disclosure Bulletin*, vol. 6, No. 3, Mar. 1981, pp. 33–36 (Navy Technology Catalog No. 5260 1530, Navy Case No. 63818).

Wang, Shay–Ping T., and Ogden, Paul, "Membrane–Type Pin Protector for Pin Grid Array Devices," 1991 IEEE/SEMI Advanced Semiconductor Manufacturing Conference, pp. 120–127.

*Primary Examiner*—Jeffrey A. Gaffin
*Assistant Examiner*—Stephen W. Jackson
*Attorney, Agent, or Firm*—Christopher P. Ricci; Joseph Stecewycz

[57] ABSTRACT

An electrostatic discharge protection device is disclosed for use with a semiconductor chip package where the electrostatic discharge protection device establishes electrical connection between connector pins on the semiconductor chip package and ground, thereby creating a short circuit to protect the semiconductor chip package from electrostatic discharge. The electrostatic discharge protection device is manually operable to engage or disengage a ground connection while remaining attached to the semiconductor chip package. The electrostatic discharge protection device is also removable from the semiconductor chip package either prior to or subsequent to mating a semiconductor chip package with a printed circuit board or other receptacle.

16 Claims, 7 Drawing Sheets

ELECTROSTATIC DISCHARGE PROTECTION DEVICE

BACKGROUND OF THE INVENTION

The present invention relates generally to electrostatic discharge protection devices. More particularly, the invention relates to electrostatic discharge protection devices for semiconductor chip packages ("SCP") where the electrostatic discharge protection device connects selected pins on the SCP so they are grounded or maintained at the same electrical potential to inhibit electrostatic charge accumulation when the SCP is not mounted on a circuit board or other receptor, and disconnects the ground connection upon operative combination of the SCP on the circuit board or other receptor or, optionally, disconnects the ground connection manually by a user.

Electrostatic charge is a stationary electric charge which accumulates on various surfaces. An electrostatic discharge occurs when the electrostatic charge becomes substantial enough to overcome a dielectric material between the charge and another surface of lower electrical potential. An example of such a discharge as naturally occurring is lightning.

Electrostatic discharge in the realm of electronics can be devastating to microelectronic devices. A sharp voltage spike caused by an electrostatic discharge can cause permanent and costly damage to individual precision devices, such as random access memory or other semiconductor devices, inter alia.

Many commercially available electrostatic discharge protection devices in use today consist primarily of electrostatic discharge packaging of the SCP in electrically conductive strips, pellets, boxes, and plastic tubing which provide effective electrostatic discharge protection until the user is about to insert the SCP into complementary receptacles on the circuit board or other receptor. At that point the user must remove the electrostatic discharge packaging from the SCP thus rendering the SCP vulnerable to electrostatic discharge in order to position and insert the connector pins into the receptacle. Accordingly, as the user inserts the connector pins of the SCP into the receptacles, the semiconductor dies housed within the SCPs could be destroyed by electrostatic discharge and the SCP would therefore have to be replaced.

Consequently a need still exists within the semiconductor chip packaging industry for a true electrostatic discharge protection device, rather than electrostatic discharge protection packaging which effectively protects the semiconductor die from electrostatic discharge until the connector pins of the SCP are inserted into the receptacles of the connector and then protects the semiconductor die from electrostatic discharge again when the connector pins are removed from the receptacles.

Prior art electrostatic discharge protection devices that are manually actuatable generally must be removed from the device. If the user is simply removing the electrostatic discharge protection device to test the semiconductor chip package then the electrostatic discharge protection device must be subsequently reinstalled. Further, there exists the possibility of misplacing the electrostatic discharge protection device while removed thereby increasing a likelihood of damage due to electrostatic discharge.

Other commonly assigned patents and copending applications include U.S. Pat. No. 4,971,568 entitled "Electrical Connector With Attachment For Automatically Shorting Select Conductors Upon Disconnection of Connector" by David V. Cronin issued Nov. 20, 1990, U.S. Pat. No. 5,163,850 entitled Electrostatic Discharge Protection Devices For Semiconductor Chip Packages" by David V. Cronin issued Nov. 17, 1992, U.S. Pat. No. 5,164,880 entitled "Electrostatic Discharge Protection Device for a Printed Circuit Board" by David V. Cronin issued Nov. 17, 1992, and pending U.S. application Ser. No. 234,917 entitled "Electrostatic Discharge Protection Device" by David V. Cronin filed Apr. 28, 1994.

Accordingly, it is an object of this invention to provide electrostatic discharge protection devices which are adapted to manually open a short circuit across the connector pins and ground while remaining attached to the semiconductor chip package.

These and other objects of the invention will be obvious and will appear hereinafter.

SUMMARY

The aforementioned and other objects are achieved by the invention which provides and electrostatic discharge protection device. The electrostatic discharge protection device is useful with semiconductor chip packages of a type having a housing for enclosing electronics and having one or more connector pins extending from the housing. The semiconductor chip package also has a ground contact for electrically grounding the semiconductor chip package to provide a reference point to the electronics contained therein. It should be noted that this arrangement is purely illustrative and should not be deemed restrictive.

The electrostatic discharge protection device comprises a grounding means which is disposed on the connector pins for selectively establishing an electrical connection between the connector pins and the ground contact. The electrostatic discharge protection device has an inoperative condition for disconnecting the shunt by sliding the electrostatic discharge protection device along the connector pins away from the ground contact, thus allowing electrical isolation between the one or more connector pins and the ground contact. In this way the electrostatic discharge protection device is manually movable between operable and inoperable positions while remaining attached to the semiconductor chip package. As required by the implementation, the electrostatic discharge protection device is also removable from the semiconductor chip package either prior to or subsequent to attachment of the semiconductor chip package to a printed circuit board or a mating receptacle.

In further aspects, the invention provides methods in accord with the apparatus described above. The aforementioned and other aspects of the invention are evident in the drawings and in the description that follows.

BRIEF DESCRIPTION OF THE DRAWINGS

The foregoing and other objects of this invention, the various features thereof, as well as the invention itself, may be more fully understood from the following description, when read together with the accompanying drawings in which.

DETAILED DESCRIPTION

Figure 1:
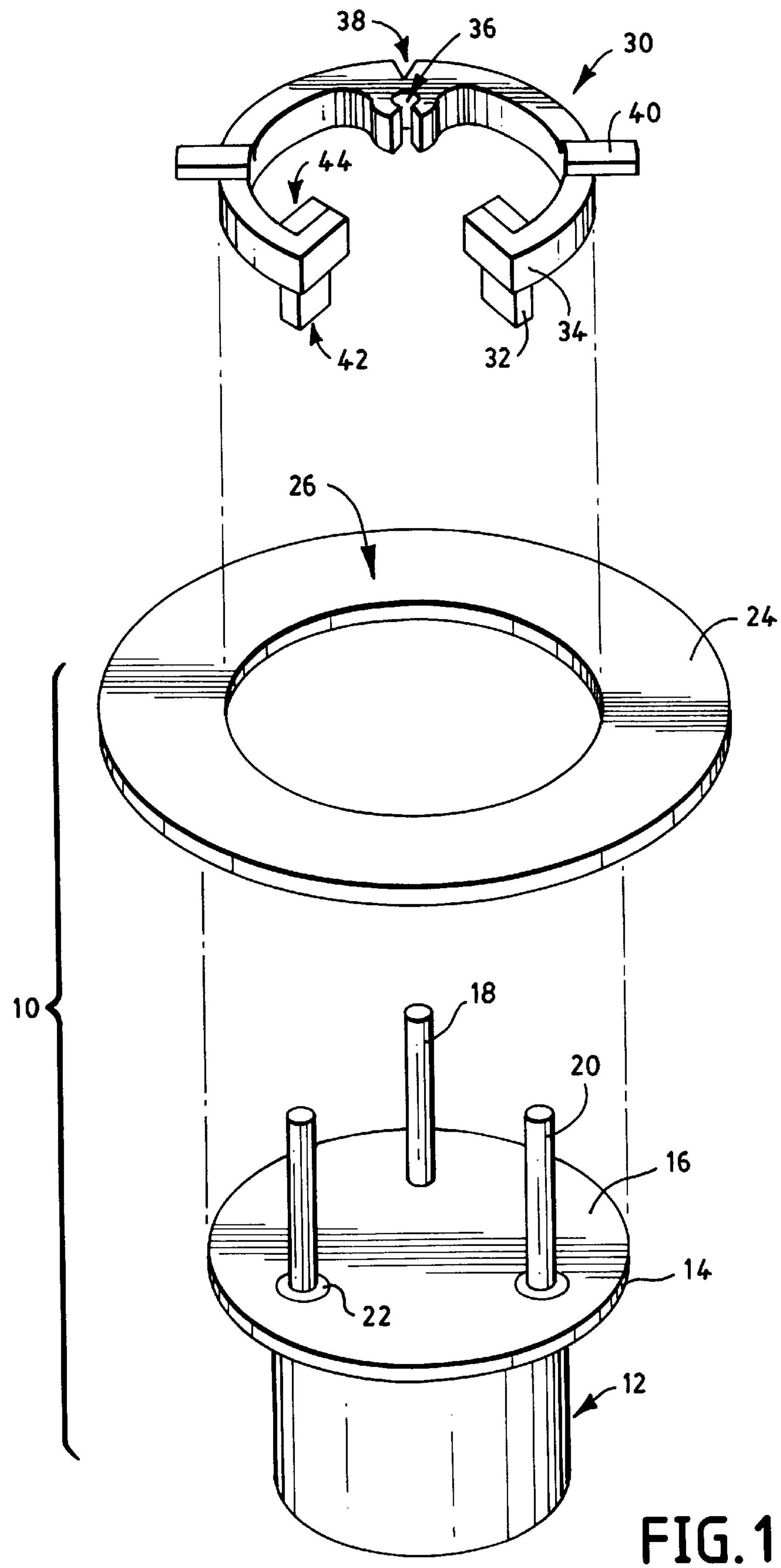
FIG. 1 shows an exploded perspective view of an electrostatic discharge protection device of this invention.
Figure 2A:
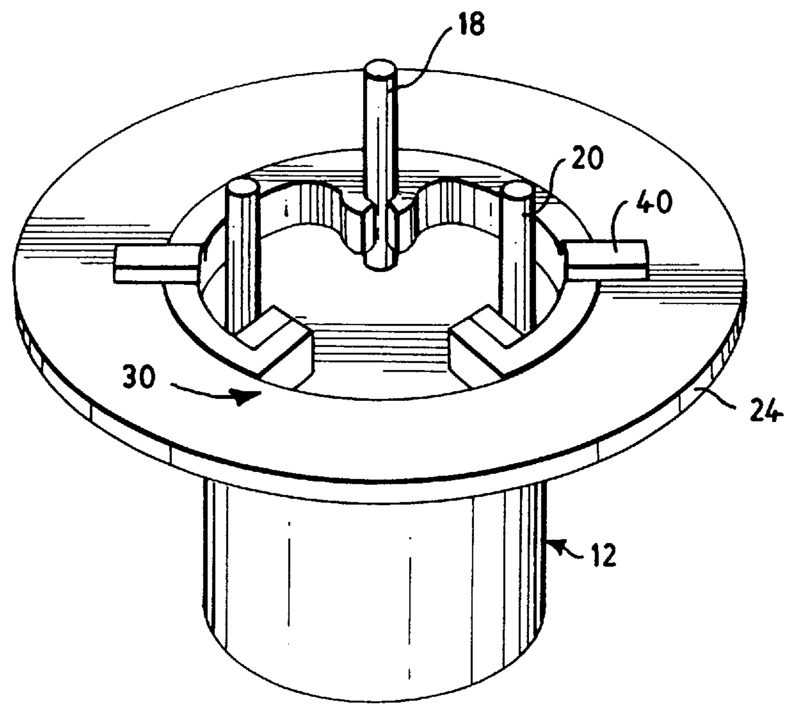
FIG. 2A shows a perspective view of an electrostatic discharge protection device as shown in FIG. 1 mated to a semiconductor chip package and a flange.

While the present invention retains utility within a wide variety of semiconductor devices and may be embodied in several different forms, it is advantageously employed in connection with semiconductor chip packages having metal housings. Though this is the form of the preferred embodiment and will be described as such, this embodiment should be considered illustrative and not restrictive.

Referring to FIGS. 1–4, an electrostatic discharge protection device 30 is shown for attachment to a semiconductor chip assembly 10. The semiconductor chip assembly 10 comprises a semiconductor chip package 12 having a base 14 which interfaces with an flange 24 on a bottom surface 16 of the base 14. The flange is for heat sinking to and adaptation of the assembly to surrounding mechanical structure.

The flange 24 has an aperture 26 which allows the connector pins 20 of the semiconductor chip package 12 to pass therethrough. The semiconductor chip package 12 also has a single ground pin 18 which extends through the aperture 26.

In this embodiment, the semiconductor chip package 12 has a metallic housing. Therefore, to inhibit conduction between the connector pins 20, there is an insulator 22 surrounding the connector pins 20 where they pass through the base 14. The insulator 22 is often fabricated of glass or ceramic, as is well known in the art.

The electrostatic discharge protection device 30 is insertable into the aperture 26 to contact connector pins 20 and the ground pin 18.

The electrostatic discharge protection device 30 is 'C' shaped with ground arms 34 that are substantially flat extending at each terminus toward each other. These ground arms 34 are flat so as to easily attach grounding bars 32.

The grounding bars 32 are fabricated of a conductive material such as copper. Grounding bars 32 ultimately will contact the connector pins 20 as will be later herein described. The grounding bars 32 are, in the preferred embodiment, independently compliant so the initial contact by one grounding bar 32 against one connector pin 20 does not restrict another grounding bar 32 from contacting its connector pin 20. This is accomplished by fabricating the grounding bars 32 from a conductive metal wool or a conductive foam pad. Alternatively, the grounding bars can be substantially rigid and the ground arms 34 can be compliant. In either embodiment, the electrostatic discharge protection device 30 resiliently conforms to the connector pins to ensure electrical connection therewith.

Securing the electrostatic discharge protection device 30 to the semiconductor chip package 12 is pin clamp 36. The pin clamp 36 is fabricated to have an interference fit with the ground pin 18, and is resiliently biased to push the ground arms 34 toward each other, thereby causing a clamping action on the ground pin 18 when inserted into the ground clamp 36.

Horizontal tabs 40 extend from a top surface of the electrostatic discharge protection device 30 to keep the electrostatic discharge protection device 30 above the flange 24. Simultaneously, the horizontal tabs 40 provide a point of mechanical contact with the electrostatic discharge protection device 30 for a user to move the electrostatic discharge protection device 30 between operative and inoperative positions.

Figure 2B:
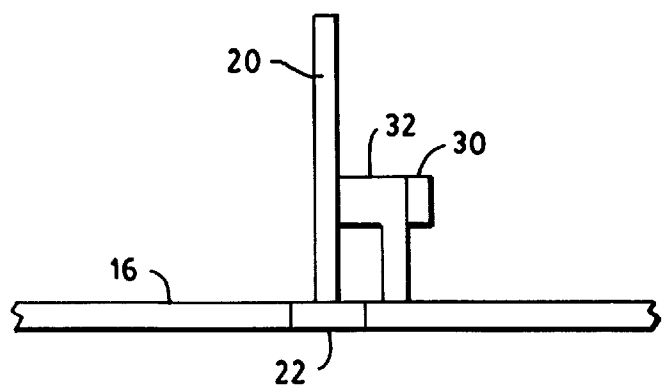
FIG. 2B is a cross-sectional view of the electrostatic discharge protection device shown in FIG. 2A attached to the semiconductor chip package.
Figure 2C:
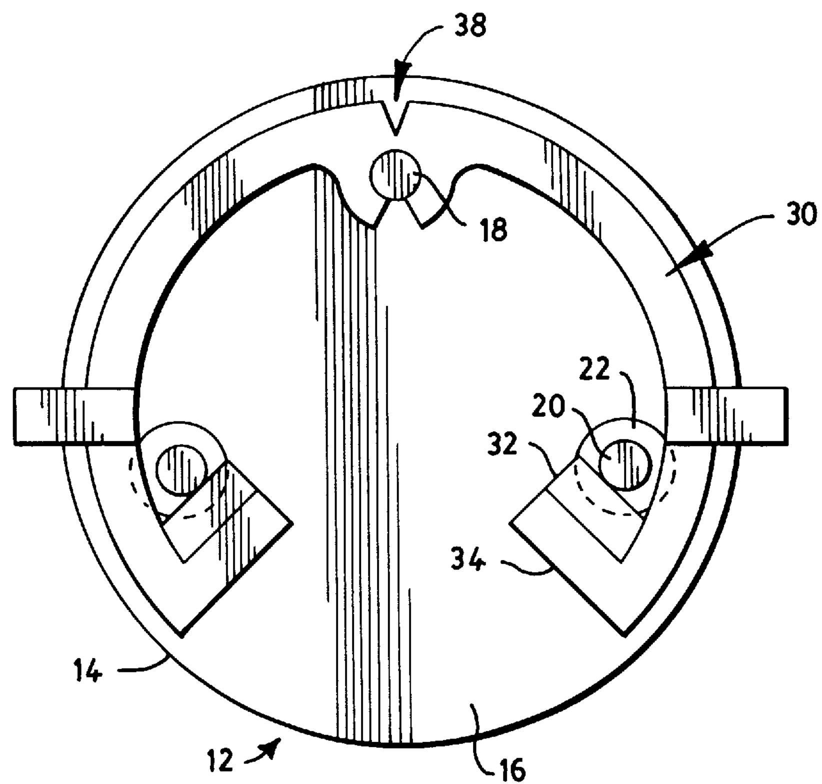
FIG. 2C is an overhead view of the electrostatic discharge protection device of FIG. 2A attached to a semiconductor chip package.

The grounding bars 32 can be simply a block of conductive material as shown in FIG. 1, or can be an L-shaped structure as shown in FIG. 2B. L-shaped structure of FIG. 2B is primarily illustrative of the electrical contacts, and is not functionally different from the block shown in FIG. 1.

Electrical contacts connect a lateral surface 44 of the grounding bar 32 to the connector pins 20. The bottom surface 42 of the grounding bar 32, when in the operative position, is placed into electrical contact with the bottom surface 16 of the base 14 of the semiconductor chip package. It should be noted that in this depiction of the semiconductor chip package, the base 14 of the semiconductor chip package 12 is integral with the grounding pin 18 in that there is no insulator 22 surrounding the grounding pin 18. Therefore, electrical connection of the grounding bar 32 to the base 14 causes a short circuit to ground between the connector pins 20 and the ground pin 18.

Figure 3:
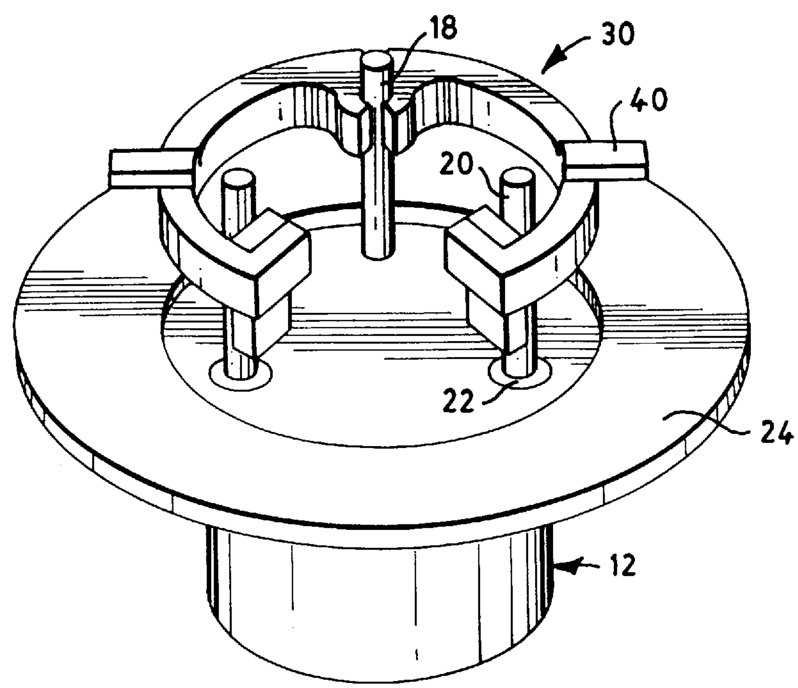
FIG. 3 is an electrostatic discharge protection device attached to a semiconductor chip package as shown in FIG. 1, where the electrostatic discharge protection device is in an inoperative position.

FIG. 3 shows the electrostatic discharge protection device 30 in an inoperative position, where the electrostatic discharge protection device 30 is slid up the connector pins 20 so as to break the electrical contact between the grounding bar 32 and the bottom surface 16 of the base 14. Sliding the electrostatic discharge protection device 30 can be performed by grabbing the horizontal tabs 40 and pulling them away from the semiconductor chip package 12. The pin clamp 36 still acts to hold the grounding pin 18, thus keeping the electrostatic discharge protection device 30 substantially secured relative to the semiconductor chip package by a frictional fit. Sliding the electrostatic discharge protection device 30 into the inoperative position temporarily allows ease of testing of the semiconductor chip package 12 where the electrostatic discharge protection device 30 can then be easily pushed back down into the operative position without ever moving the electrostatic discharge protection device from the semiconductor chip package 12.

Figure 4:
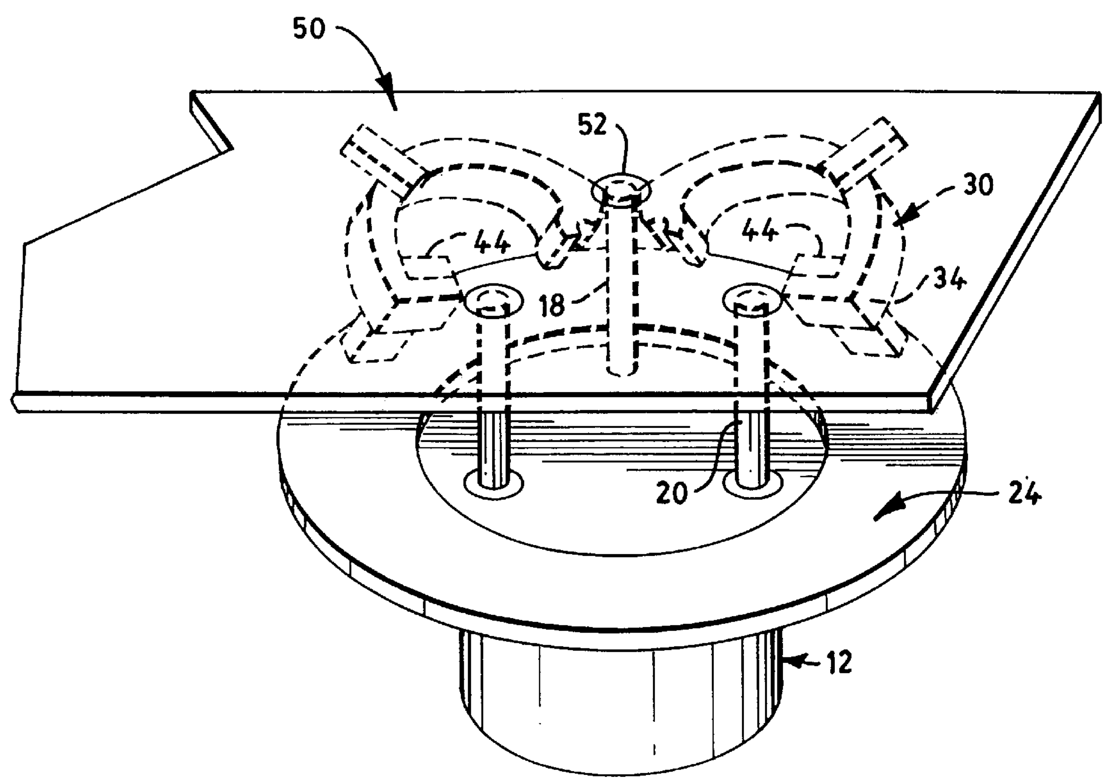
FIG. 4 is an electrostatic discharge protection device attached to a semiconductor chip package according to FIG. 1 where the semiconductor chip package is attached to a circuit board. The electrostatic discharge protection device is being retracted.

FIG. 4 illustrates the semiconductor chip package 12 soldered to a printed circuit board 50 where the connector pins 20 and ground pins 18 are shown permanently attached to the printed circuit board 50 at solder joints 52. Now that this permanent attachment to the printed circuit board 50 has been made, the electrostatic discharge protection device 30 may be removed. This is accomplished by moving the electrostatic discharge protection device 30 into the inoperative position and then bending the horizontal tabs . . . away from each other along a plane of the electrostatic discharge protection device 30 such that a V cut 38 in the electrostatic discharge protection device 30 closes until electrostatic discharge protection device 30 snaps into two separate pieces. Optionally, this same movement can be used to simply overcome the inward bias of the pin clamp 36, and the entire device can be removed without breaking the electrostatic discharge protection device 30.

Figure 5:
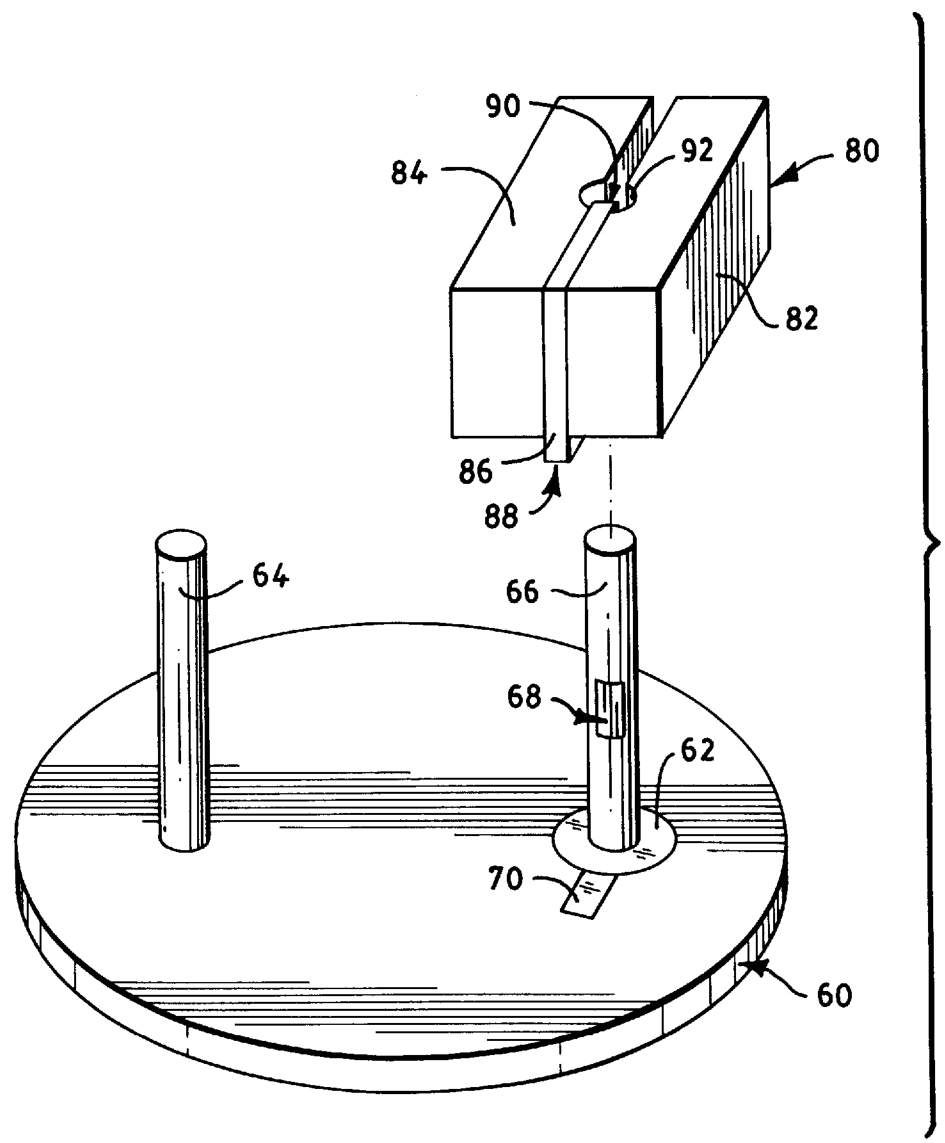
FIG. 5 is an exploded perspective view of an electrostatic discharge protection device of this invention.
Figure 6:
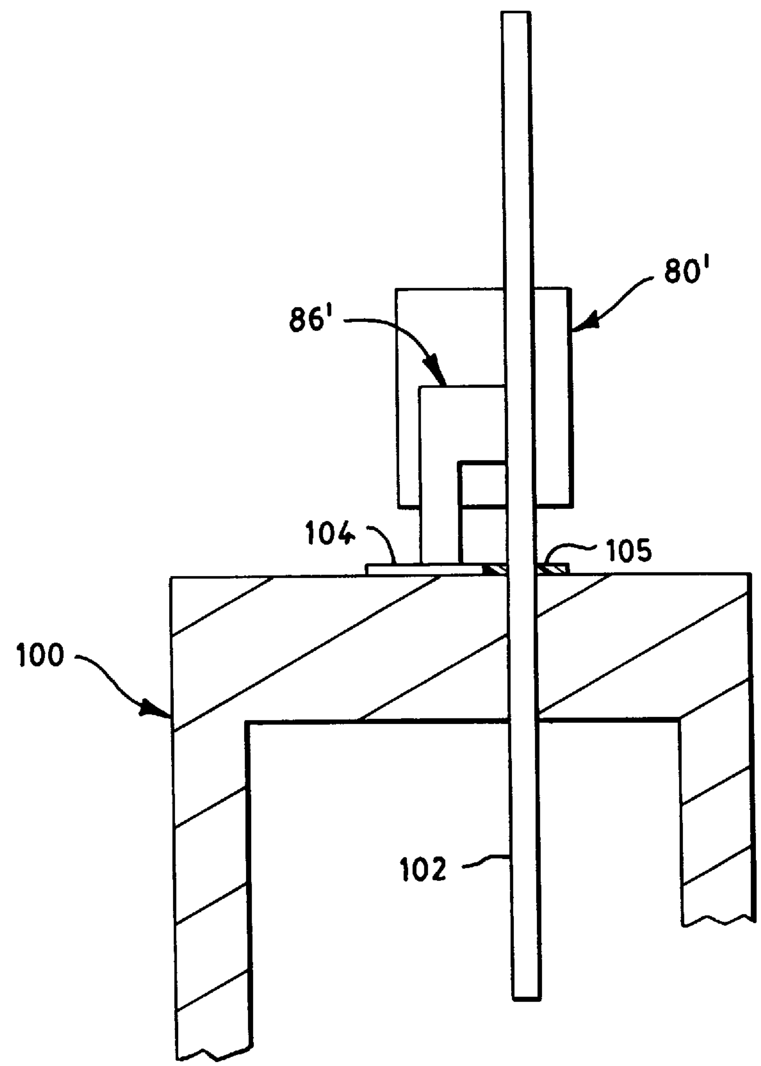
FIG. 6 is a cross-sectional view of the electrostatic discharge protection device of FIG. 5 attached to a semiconductor chip package.

The second embodiment of the electrostatic discharge protection device is shown in FIGS. 5 and 6. This embodiment of the electrostatic discharge protection device 80 is useful for semiconductor chip packages 60 where the number of connector pins 66 extending from the semiconductor chip package 60 through the insulator 62 makes the previous embodiment impractical. This happens when there is only a single connector pin 66 or there are greater than two connector pin 66, or simply that the arrangement of the connector pins with respect to the ground pin is not amenable to the previous embodiment, for example, semiconductor chip packages using a linear array of connector pins 66. The electrostatic discharge protection device 80 is more amenable to these arrangements because it is substantially self-contained with respect to each connector pin 66 and makes its own connection to the ground pin 64 via the semiconductor chip package 60. Multiple electrostatic discharge protection devices 80 can be secured together linearly or in other arrangement to accommodate almost any combination of connector pins 66 by adapting to most semiconductor chip packages 60.

The electrostatic discharge protection device 80 has a first half clamp 82 attached to a second half clamp 84 with a conductive bar 86 sandwiched in between. First and second half clamps 82, 84 are secured together such that there is a resilient inward bias to clamp the connector pins 66 therebetween. Conductive bar 86 is shown having a bottom surface 88 and a lateral surface 90 which make electrical contacts with the connector pins 66 as previously described. When the connector pin 66 is inserted into the clamp slot 92, the lateral surface 90 of the conductive bar 86 contacts the connective pin 66 at the connector contact 68 in the electrostatic discharge protection device is in the operative position, pushed down fully against the semiconductor chip package, the bottom surface 88 makes electrical contact with the ground contact 70, which is electrically connected to the ground pin 64, thereby establishing a shunt between the connector pin 66 and the ground pin 64.

As previously described, this electrostatic discharge protection device 80 is slid upward away from the semiconductor chip package 60 along the connector pin 66 such that the connection between the bottom surface 88 of the conductive bar 86 is broken with the ground contact 70 on the semiconductor chip package 60.

In addition to further illustrating the connection made with the semiconductor chip package 60, FIG. 6 shows an alternative embodiment where the semiconductor chip package 100 is fabricated to have a housing that is nonconductive. Since the housing of the semiconductor chip package is non-conductive, making electrical connection between the conductive bar 86' and the semiconductor chip package 100 does not make the necessary shunt with the ground pin. In this case the connector pin 102 which extends through the housing of the semiconductor chip package 100 is connected via the conductive bar 86' of the electrostatic discharge protection device 80' to a ground strip 104 which is added to the semiconductor chip package 100 as part of the shunting means.

The ground strip 104 is fabricated from any conductive material and is added to provide an auxiliary common ground contact on the semiconductor chip package 100. The ground strip 104 can be a substantially flat section of conductive metal attached to the semiconductor chip package 100 with an adhesive or other mechanical means, e.g. a non-conductive nib 105 integral with ground strip 104 and having interference fit with connector pins 102.

Figure 7A:
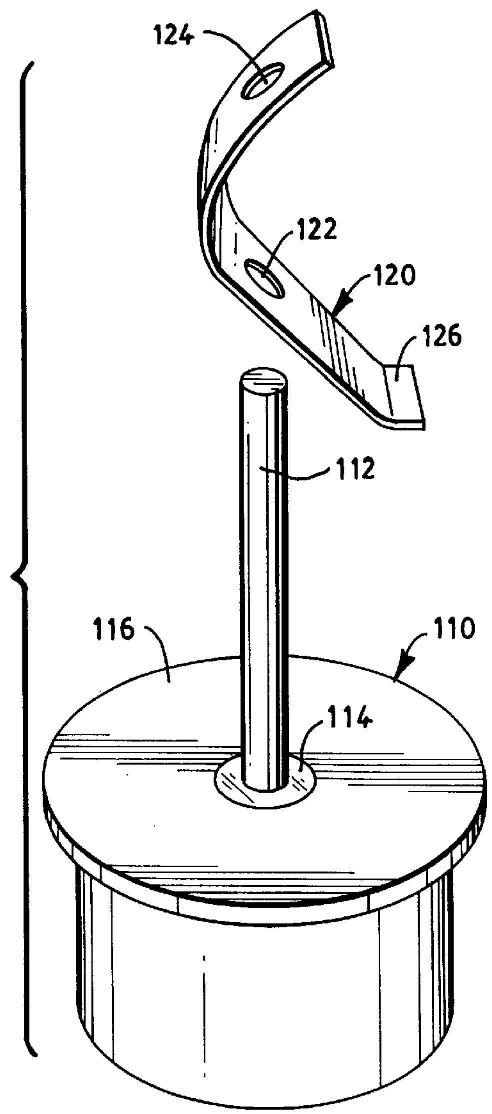
FIG. 7A is an exploded perspective view of an electrostatic discharge protection device of this invention.
Figure 7B:
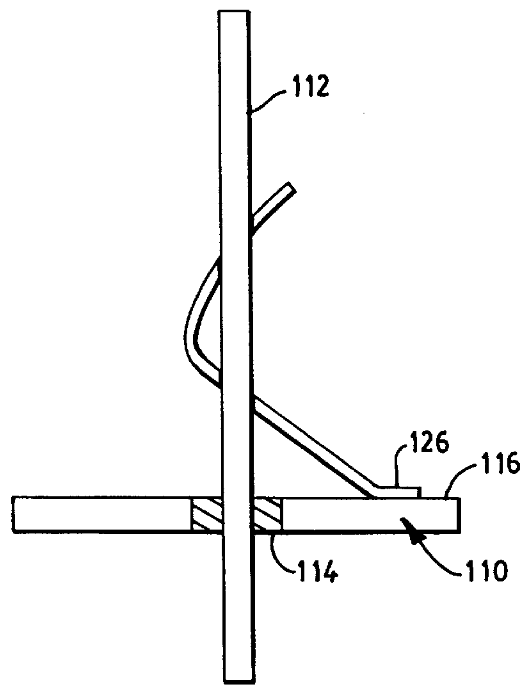
FIG. 7B is a cross-sectional view of the electrostatic discharge protection device of FIG. 7 attached to a semiconductor chip package.

FIGS. 7A and 7B show an alternative embodiment to the electrostatic discharge protection device 80 attached to a semiconductor chip package 110. As before, the semiconductor chip package 110 has a connector pin 112 extending therefrom through an insulator 114. The connector pin 112 extends from a bottom surface 116 of the semiconductor chip package 110 where the bottom surface 116 is again fabricated of a conductive material. In the embodiment shown, there is not a ground pin. This embodiment of the semiconductor chip package, ground is made directly to the semiconductor chip package 110, which is fabricated of a conductive material and therefore the entire housing is designated to be ground. Alternatively, if a ground contact is otherwise made, the conductive strip of the previous embodiment can also be used.

The electrostatic discharge protection device 120 attaches to the connector pin 112 using a first hole 122 and a second hole 124. The electrostatic discharge protection device 120 is fabricated of a resilient conductive material which is biased towards becoming substantially straight. Bending the electrostatic discharge protection device 120 causes the electrostatic discharge protection device 120 to push towards its linear orientation, which will ultimately be used to secure the electrostatic discharge protection device to the semiconductor chip package 110.

The electrostatic discharge protection device 120 is inserted over the connector pin 112 by moving the connector pin 112 into the first hole 122. The electrostatic discharge protection device 120 is then bent so as to allow the connector pin 112 to pass through the second hole 124 where the resilient bias forces the edges of the connector hole into a frictional fit with the connector pin 112, thus securing the electrostatic discharge protection device 120 on the connector pin 112.

When the electrostatic discharge protection device is pushed down into an operative position, the ground contact 126 makes mechanical and electrical contact with the bottom surface 116 of the semiconductor chip package 110. Since the bottom surface 116 is the ground contact for the semiconductor chip package 110, an electrical shunt is made between the connector pin 112 and ground. Sliding the electrostatic discharge protection device 120 vertically along the connector pin 112 away from the semiconductor chip package moves the ground contact 126 away from the bottom surface 116, thus breaking the electrical connection and moving the electrostatic discharge protection device into the inoperative position.

Removal of the electrostatic discharge protection device when desired is simply accomplished by pulling the electrostatic discharge protection device 120 further vertically along the ground pin 112 until the connector pin 112 is removed from the second hole 124. This releases the frictional fit from the connector pin 112 and the device is therefore easily removable from the second hole 122, completely removing the electrostatic discharge protection device 120 from the semiconductor chip package 110.

Alternatively, the device could be cut and removed from the pin after mounting to PC circuit board or other receptor The invention may be embodied in other specific forms without departing from the spirit or essential characteristics thereof. The present embodiments are, therefore, to be considered in all respects as illustrative and not restrictive, the scope of the invention being indicated by the appended claims rather than by the foregoing description, and all changes which come within the meaning and range of equivalency of the claims are therefore intended to be embraced therein.

The embodiments of the invention in which an exclusive property or privilege is claimed are defined as follows:

1. An electrostatic discharge protection device suitable for use with a semiconductor chip package of a type having a housing with a surface at electrical ground potential, one or more connector pins extending from and electrically isolated from the ground surface, and a ground pin extending from and electrically connected to the ground surface, said electrostatic discharge protection device comprising: one or more grounding means disposed on said one or more connector pins, said electrostatic discharge protection device having an operating position in which there is established an electrical connection between each connector pin and the ground surface, and an inoperative position in which there is no electrical connection between each connector pin and the ground surface, said grounding means comprising clamp means for frictionally securing said grounding means to one pin such that said grounding means is releasably fixed adjacent the ground surface in the operative position and releasably fixed distal from the ground surface in the inoperative position.

2. The electrostatic discharge protection device according to claim 1 further comprising a conductive strip secured to the housing, said conductive strip providing an electrical path between said grounding means and the ground surface.

3. The electrostatic discharge protection device according to claim 1 wherein said grounding means further comprises at least one tab extending from said grounding means, said tab serving to limit the positioning of said electrostatic discharge protection device.

4. The electrostatic discharge protection device according to claim 1 wherein the semiconductor chip package further includes a ferrule and the electrostatic discharge protection device is recessable into the ferrule.

5. The electrostatic discharge protection device according to claim 1 wherein said grounding means further comprises at least one interjacent structure comprising two half clamps opposed about a conductive bar, each said interjacent structure disposed upon a corresponding connector pin.

6. The electrostatic discharge protection device according to claim 1 wherein said grounding means is a unitary conductive element.

7. The electrostatic discharge protection device according to claim 1 wherein said grounding means is compliant with respect to the one or more connector pins to ensure contact of said grounding means with the connector pins.

8. The electrostatic discharge protection device according to claim 1 wherein said grounding means further comprises one or more conductive bars corresponding to the one or more connector pins each said conductive bar providing an electrical path between the corresponding connector pin and the ground surface.

9. The electrostatic discharge protection device according to claim 8 wherein the one or more connector pins are electrically isolated from the ground surface by an annular insulator, and wherein each said conductive bar comprises a length greater than the width of the insulator annulus wall.

10. The electrostatic discharge protection device according to claim 8 wherein said conductive bar is L-shaped.

11. The electrostatic discharge protection device according to claim 8 wherein said conductive bar is compliant to the corresponding connector pin to ensure electrical contact of said grounding means with each of the one or more connector pins.

12. The electrostatic discharge protection device according to claim 1 wherein said grounding means further comprises separation means such that said electrostatic discharge protection device is permanently removable from the semiconductor chip package.

13. The electrostatic discharge protection device according to claim 12 wherein said separation means comprises a notch in said electrostatic discharge protection device said notch providing a break point in said electrostatic discharge protection device.

14. The electrostatic discharge protection device according to claim 13 wherein said notch is V-shaped.

15. An electrostatic discharge protection device for use with a semiconductor chip package of a type having a housing with a surface at electrical ground potential, one or more connector pins extending from and electrically isolated from the ground surface, and a ground pin extending from and electrically connected to the ground surface, said electrostatic discharge protection device comprising: grounding means comprising two or more receiving holes for engaging a respective connector pin, said electrostatic discharge device being biased such that edges of two said receiving holes mechanically interact with the one respective connector pin so as to frictionally secure said electrostatic discharge protection device to the semiconductor chip package, said grounding means serving to selectively establish an electrical connection between the connector pins and the ground surface.

16. The electrostatic discharge protection device according to claim 15 wherein said grounding means is a unitary conductive element.

* * * * *